(12) United States Patent
Khouri et al.

(10) Patent No.: US 7,471,576 B2
(45) Date of Patent: Dec. 30, 2008

(54) METHOD OF TRANSFERRING DATA IN AN ELECTRICALLY PROGRAMMABLE MEMORY

(76) Inventors: Osama Khouri, Via Vespri Sicilliani, 1, I-20146 Milan (IT); Stefano Zanardi, Via Carducci, 4, I-24068 Seriate (IT); Giulio Martinozzi, Via Fratti, 2, I-58024 Massa Marittima (IT)

( * ) Notice: Subject to any disclaimer, the term of this patent is extended or adjusted under 35 U.S.C. 154(b) by 0 days.

(21) Appl. No.: 11/931,497

(22) Filed: Oct. 31, 2007

(65) Prior Publication Data

US 2008/0065823 A1 Mar. 13, 2008

Related U.S. Application Data

(62) Division of application No. 11/134,158, filed on May 20, 2005, now Pat. No. 7,298,650.

(30) Foreign Application Priority Data

May 20, 2004 (EP) .................................. 04102232

(51) Int. Cl.
*G11C 7/10* (2006.01)
*G11C 11/34* (2006.01)
*G11C 16/04* (2006.01)
*G11C 8/00* (2006.01)

(52) U.S. Cl. .............................. 365/189.05; 365/185.12; 365/189.12; 365/230.08; 365/238.5

(58) Field of Classification Search ............ 365/185.12, 365/189.05, 189.12, 230.08, 238.35
See application file for complete search history.

(56) References Cited

U.S. PATENT DOCUMENTS 5,546,341 A * 8/1996 Suh et al. ................ 365/185.33

(Continued)

FOREIGN PATENT DOCUMENTS

EP 0 608 075 7/1994

OTHER PUBLICATIONS

Seungjae Lee et al., "A 3.3V 4Gb Four-Level NAND Flash Memory with 90nm CMOS Technology", ISSCC 2004/Session 2/ Non-Volatile Memory/ 2.7, IEEE International Solid-State Circuits Conference, 2004, XP010722148, ISBN: 0-7803-8267-6.

(Continued)

*Primary Examiner*—Ly D Pham
(74) *Attorney, Agent, or Firm*—Blakely, Sokoloff, Taylor & Zafman LLP

(57) ABSTRACT

A method is provided for transferring data in a memory that includes memory cells forming memory pages, and a page buffer that includes a register, with signal lines selectively transferring data stored in the register to the memory cells of a selected one of the memory pages and an output interface of the memory. Data read from or to be written to the memory cells of the selected one of the memory pages is at least temporarily stored in the register, and outputs of the register are buffered so as to decouple the outputs of the register from the signal lines. The signal lines include bitlines that are each coupled to some of the memory cells and data lines that are coupled to the output interface of the memory. The buffering comprises selectively driving the bitlines or the data lines according to a data word that is stored in the register.

19 Claims, 2 Drawing Sheets

U.S. PATENT DOCUMENTS

| | | |
|---|---|---|
| 5,724,284 A | 3/1998 | Bill et al. |
| 6,278,636 B1 | 8/2001 | Lee |
| 6,304,486 B1 * | 10/2001 | Yano .................... 365/185.22 |
| 6,735,116 B2 | 5/2004 | Lee et al. |
| 2003/0072175 A1 | 4/2003 | Kawamura |
| 2003/0076719 A1 | 4/2003 | Byeon et al. |
| 2003/0117856 A1 | 6/2003 | Lee et al. |
| 2004/0001356 A1 | 1/2004 | Kawamura et al. |
| 2006/0007774 A1 | 1/2006 | Zanardi et al. |
| 2006/0039197 A1 | 2/2006 | Khouri et al. |

OTHER PUBLICATIONS

European Search Report for Application EP 04 10 2232 Dated May 2, 2005.

* cited by examiner ced to a certain voltage, for example to the power supply voltage $V_{DD}$ (typically, 3 V).

METHOD OF TRANSFERRING DATA IN AN ELECTRICALLY PROGRAMMABLE MEMORY

CROSS-REFERENCE TO RELATED APPLICATIONS

This application is a divisional of prior U.S. application Ser. No. 11/134,158, filed May 20, 2005, now U.S. Pat. No. 7,298,650. The entire disclosure of U.S. application Ser. No. 11/134,158 is herein incorporated by reference.

Additionally, this application is based upon and claims priority from prior European Patent Application No. 04 102 232.8, filed May 20, 2004, the entire disclosure of which is herein incorporated by reference.

FIELD OF THE INVENTION

The present invention generally relates to the field of solid-state memories, particularly to semiconductor memories, and even more particularly to the field of non-volatile memories that are electrically programmable.

BACKGROUND OF THE INVENTION

Non-volatile memories are commonly used in several applications in which the data stored in the memory device needs to be preserved even in the absence of a power supply. Within the class of non-volatile memories, electrically programmable (and erasable) memories, such as flash memories, have become very popular in applications in which the data to be stored is not immutable (e.g., in the case of a consolidated code for a microprocessor), but it is instead necessary from time to time to store new data, or to update the data already stored.

Typically, the memory device includes an arrangement of memory cells, disposed for example in rows and columns, so as to form a matrix.

Depending on the way the memory cells in the matrix are interconnected, two classes of flash memories can be identified: those having a NOR architecture (or "NOR flash memories"), and those having a NAND architecture, (referred to as "NAND flash memories"). Roughly speaking, in a NOR architecture the memory cells of the same matrix column are connected in parallel to the same bitline, whereas in a NAND architecture groups of memory cells of the same matrix column are serially interconnected so as to form strings, which strings are then connected in parallel to each other to the same bitline.

Compared to NOR flash memories, NAND flash memories are more compact (a lower number of contacts in the matrix are required), and they are also better suited for applications such as file storage.

In the NAND architecture, the memory space is ideally partitioned into a plurality of memory pages, with each page corresponding to a block of memory cells that, in operation, are read or written simultaneously, i.e., in parallel to each other. The number of memory cells in each block determines the size (i.e., the number of bits) of the memory page. Nowadays, memory pages of 512 bytes are rather typical, but larger memory pages are also encountered, for example of 2 KB.

Clearly, the memory cannot have so high a number of Input/Output ("I/O") terminals as to enable transferring in parallel of so long of data words; usually, eight or sixteen I/O terminals are in fact provided. Thus, some kind of "segmentation" of the memory page is necessary for interfacing the memory with the outside world.

For this purpose, a circuit arrangement called "page buffer" is provided in the memory for managing the operations of reading the information stored in the memory cells of a selected memory page, or writing new information thereto. In very general terms, the page buffer includes a buffer register of size equal to that of the memory page, in which data read (in parallel) from the memory cells of a selected page are temporarily stored, before being serially outputted in chunks of, e.g., eight or sixteen bits, depending on the number of I/O terminals of the memory. Similarly, when data are to be written into the memory, the page buffer is replenished with data received serially in the eight- or sixteen-bit chunks, and, when the buffer has eventually been filled, the data are written in parallel into the memory cells of a given, selected memory page.

The page buffer includes a relatively high number of volatile storage elements, typically bi-stable elements or latches; the number of latches is proportional (in particular, equal) to the size (in number of bits) of the memory page. Thus, the page buffer is a circuit block that needs to be carefully designed (both at the circuit and at the physical layout level), so as to ensure that it does not occupy too large a semiconductor area, and it is efficient, particularly from the power consumption viewpoint.

If the operations to be performed on the memory cells are simply a "PAGE READ" (an operation involving reading data from a selected memory page) and a page write or "PAGE PROGRAM" (writing data into a selected memory page), the page buffer may in principle include a single register, with a number of latches equal to the size (in bits) of the memory pages. However, more complex operations may be desirable and required, and in these cases the structure of the page buffer may need to be upgraded. For example, in some applications it might be necessary that the memory is capable of performing operations such as a "COPY-BACK PROGRAM" and a "CACHE PROGRAM". In a CACHE PROGRAM operation, data to be written into a memory page can be loaded into the page buffer while another memory page is still being written with data previously loaded in the page buffer; in this way, the time necessary for programming different memory pages in sequence is reduced. A COPY-BACK PROGRAM operation is instead exploited for copying the data contained in a given memory page into another memory page, in a way that is managed completely internally to the memory, without the necessity of outputting the data. A page buffer adapted to implement these two additional operations needs to include a pair of buffer registers (and thus two arrays of latches) that can be coupled to two selectable packets of bit lines of the matrix. In this case, the requirements of careful design of the page buffer are even stricter.

There has been identified some problems affecting the known page buffers.

As mentioned above, the latches making up the registers in the page buffer are volatile storage elements, and such elements, in a simple but common practical implementation, are formed by two CMOS inverters connected to each other so as to form a loop, i.e., with the output of one inverter connected to the input of the other. In a generic program operation (either a PAGE PROGRAM or a CACHE PROGRAM or COPY-BACK PROGRAM), a generic bit of the data word to be written into a selected memory cell is first loaded into the latch, and then the content of the latch is transferred onto the selected bitline by activating an electrical connection of the latch output to the bitline (normally, selection pass MOSFETs are used to this end). The bitline normally has associated therewith a relatively high stray capacitance, which is typically on the order of some picofarads, and is normally precharged to a program inhibition voltage. When the latch output is connected to the bitline, a charge sharing takes place, whereby the charge stored in the bitline capacitance and in a parasitic capacitance associated with the latch output is redistributed between such two capacitances. The latch output capacitance is however far smaller than the bitline capacitance (in a typical design, the latch output capacitance may be on the order of some femtofarads, i.e., roughly three orders of magnitude lower than the bitline capacitance). The result of the charge sharing is that the bitline capacitance may easily prevail over the driving capability of the latch, and the voltage at the latch output vary depending on the bitline voltage. This may cause the latch to be incapable of driving the bitline in a way that is sufficient to cause the programming into the desired state of the selected memory cell (the latch is not capable of bringing the bitline from the initial, program inhibition voltage to a voltage adapted to cause programming of the selected memory cell) and, in the worst cases, the latch may even be caused to switch, with the consequence that the data bit stored in the latch is modified.

A similar problem is experienced during a read operation (such as a PAGE READ). In this case, the generic latch of the page buffer register, after having been loaded with the data bit read from the selected memory cell, is connected to a data line for transporting the data bit from the page buffer latch to output buffer circuits and then to the I/O terminal of the memory. The data line, similarly to the bitline, usually has associated therewith a relatively high stray capacitance, substantially higher than the latch output capacitance. Thus, the charge sharing between the latch output capacitance and the data line parasitic capacitance may easily cause the latch to be incapable of properly driving the data line, or even to switch and lose the stored data bit.

It is observed that the problems described above are experienced both in the case in which the page buffer includes only one register, and in cases of more complex page buffers, with two (and possibly more) registers.

SUMMARY OF THE INVENTION

In view of these drawbacks, it is an object of the present invention to provide an improved page buffer that is less affected, or not affected at all, by the above-mentioned drawbacks.

One embodiment of the present invention provides a page buffer for an electrically programmable memory that includes memory cells forming memory pages. The page buffer includes a register for at least temporarily storing data read from or to be written to the memory cells of a selected one of the memory pages. The register includes latches and buffer elements. Each of the latches is coupled to at least one signal line for transferring a data bit that is stored in the latch. Each of the buffer elements decouples an output of a corresponding one of the latches from the signal line, with the buffer element driving the signal line according to the data bit that is stored in the corresponding latch.

Another embodiment of the present invention provides an electrically programmable memory that includes memory cells forming memory pages, and a page buffer coupled to the memory cells. The page buffer includes a register for at least temporarily storing data read from or to be written to the memory cells of a selected one of the memory pages. The register includes latches and buffer elements. Each of the latches is coupled to at least one signal line for transferring a data bit that is stored in the latch. Each of the buffer elements decouples an output of a corresponding one of the latches from the signal line, with the buffer element driving the signal line according to the data bit that is stored in the corresponding latch.

A further embodiment of the present invention provides a method of transferring data from a register to signal lines in an electrically programmable memory. The memory includes memory cells forming memory pages, and a page buffer that includes the register. The signal lines transfer the data stored in the register to a selected one of the memory pages and/or an output circuit of the memory. According to the method, data read from or to be written to the memory cells of a selected one of the memory pages is at least temporarily stored in the register, and outputs of the register are buffered so as to decouple the outputs of the register from the signal lines.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
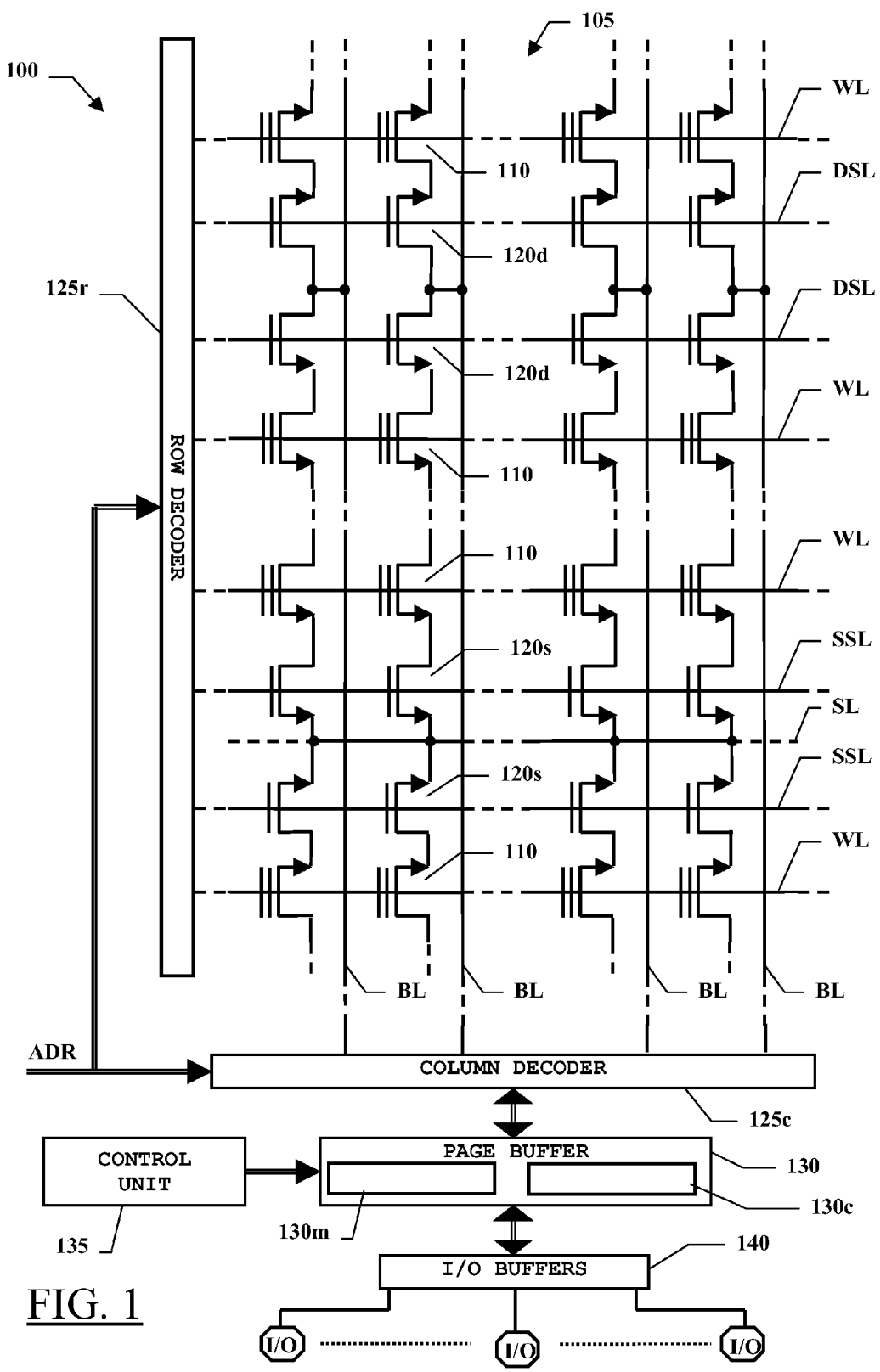
FIG. 1 shows the functional blocks of a NAND flash memory according to a preferred embodiment of the present invention.

FIG. 1 illustrates a non-volatile semiconductor memory 100 according to a preferred embodiment of the present invention. The memory 100 is an electrically-programmable, non-volatile semiconductor memory, for example a flash memory.

The flash memory 100 is integrated in a chip of semiconductor material, and includes a matrix 105 of memory cells 110 arranged in a plurality of rows and a plurality of columns.

In this embodiment, each memory cell 110 consists of an N-channel MOS transistor having a charge-storage element, such as a conductive floating gate that is adapted to be charged by injected electrons. Without going into excessive detail, in an erased condition (associated by convention with a stored logic value of "1"), the memory cell 110 has a low threshold voltage value. The memory cell 110 is programmed by injecting electric charges into its floating gate. In the programmed condition (associated by convention with a stored logic value of "0"), the memory cell 110 has a high threshold voltage value. Therefore, when a selected memory cell 110 is biased for reading its content, the memory cell 110 will be conductive if erased or non-conductive if programmed.

The flash memory 100 has a NAND architecture. In the matrix 105, groups of, e.g., eight, sixteen or even more (e.g., thirty-two) memory cells 110 are connected in series to each other to form a memory cell string, and different memory cell strings belonging to the same matrix column are connected in parallel to each other to the same bitline BL.

The memory cells 110 of a generic string are in particular connected in series between a source select N-channel MOS transistor 120s and a drain select N-channel MOS transistor 120d. A generic, intermediate memory cell 110 in the memory cell string has its drain terminal connected to the source terminal of an adjacent memory cell 110 in the string, and its source terminal connected to the drain terminal of another adjacent memory cell 110 in the string. One of the two end memory cells 110 located at the ends of the string has its drain terminal connected to the source terminal of the drain select transistor 120d; the drain terminal of the drain select transistor 120d is connected to the corresponding bitline BL, as well as to the drain terminal of the corresponding drain select transistor 120d of an adjacent memory cell string. Likewise, the other end memory cell 110 of the string has its source terminal connected to the drain terminal of the source select transistor 120s; the source terminal of the source select transistor 120s is connected to the source terminal of the corresponding source select transistor 120s of another adjacent memory cell string.

The control gate terminals of the memory cells 110 in each row are connected to a corresponding wordline WL. The gate terminals of the drain select transistors 120d belonging to a common row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a common column of the matrix 105 are connected to a corresponding bitline BL. Conversely, the source terminals of all of the source select transistors 120s in the matrix 105 are connected to a common source line SL (which is typically kept at a reference voltage, or ground).

The memory cells 110 belonging to the same row are logically partitioned into memory pages. Assuming, merely by way of example, that the matrix 105 includes 8192 bitlines BL, two memory pages of 512 bytes each for each wordline WL are defined; for example, a first page consisting of the memory cells 110 in an even position, and a second page consisting of the memory cells 110 in an odd position. Thus, if, still by way of example, the matrix 105 includes 2048 wordlines WL, the memory 100 has a total of 4096 memory pages of 512 bytes each. The number of bitlines and wordlines, as well as the size of the memory page, may vary greatly, and the examples given herein are not meant to limit the present invention. For example, the number of memory pages that are associated with a generic wordline may be higher than two, particularly multiples of two, such as four, eight and so on.

The flash memory 100 receives an address code ADR for selecting a desired memory page. A portion of the address code ADR is supplied to a row decoder 125r, which selects the desired word line WL, as well as the drain select line DSL and the source select line SSL of the corresponding memory sector 115. Another portion of the address code ADR is supplied to a column decoder 125c; the column decoder 125c connects the desired bit lines BL to a page buffer 130.

As will be described in greater detail below, the page buffer 130 is exploited as temporary storage during read/write operations on the memory cells 110 of the selected pages.

The page buffer 130 is in communication with I/O buffers 140, which are in turn associated with I/O terminals I/O of the flash memory 100.

The operation of the flash memory 100 is generally managed by a control unit 135, for example a microcontroller.

A generic memory page is selected by selecting a given wordline WL, and a packet of bitlines BL. For example, if two memory pages of 512 bytes each exist for each wordline, one page corresponding to the memory cells in even positions and the other page to the memory cells in odd positions, the packet of selected bitlines BL includes the 4096 bitlines in even positions or the 4096 bitlines in odd positions.

During a read operation (PAGE READ), a data word (consisting of, e.g., 512 bytes) stored in the selected memory page is read out and latched into the page buffer 130. The data word, temporarily stored in the page buffer 130, is then serially outputted through the I/O terminals I/O in chunks of, e.g., eight or sixteen bits.

In greater detail, in order to access a given memory cell 110 for reading the content thereof, the drain select transistor 125d and the source select transistor 125s in the memory cell string to which the cell belongs are turned on, by asserting the drain select line DSL and the source select line SSL (for example, these two lines are brought to a voltage equal to the supply voltage Vdd of the memory, e.g., 3 V). The bitline BL to which there is connected the string of cells containing the memory cell to be read is selected by the column decoder 125c. The row decoder 125r biases the wordline WL to which the selected memory cell belongs to a voltage that is intermediate between the erased threshold voltage value and the programmed threshold voltage value (e.g., ground). The remaining wordlines WL controlling the gates of the other memory cells of the same string are all brought to a potential that is sufficiently high to ensure that these memory cells are turned on irrespective of their programming state (for example, a voltage of approximately 10V). All of the other wordlines WL (associated with different memory cell strings) are for example kept grounded.

During a write operation (PAGE PROGRAM), a data word to be written, received from outside the memory through the I/O terminals I/O, is loaded into the page buffer 130. The data word to be written is received serially in, e.g., eight- or sixteen-bits chunks, and the page buffer 130 is thus replenished with data in a sequence of steps; when the buffer has eventually been filled, the data are written in parallel into the memory cells of a given selected page.

In order to access a given memory cell 110 for programming it, the drain select transistor 125d in the memory cell string to which the cell belongs is turned on by asserting the drain select line DSL (for example, bringing this line to the supply voltage Vdd), whereas the source select transistor 125s is kept off by keeping the source select line SSL deasserted (e.g., grounded). The bitline BL to which there is connected the string of cells containing the memory cell to be programmed is selected by the column decoder 125c. The row decoder 125r biases the wordline WL to which the selected memory cell belongs to a high programming voltage, e.g., 20 V; the remaining wordlines WL controlling the gates of the other memory cells of the same string are all brought to a potential (e.g., approximately 10 V) that is sufficiently high to ensure that these memory cells are turned on irrespective of their programming state, but sufficiently lower than the programming voltage, so as not to cause spurious programming. All the other wordlines WL (associated with different memory cell strings) are for example kept grounded.

In order to program the selected memory cell, the bitline BL is kept grounded, so that the drain select transistor 125d is surely kept on; the ground voltage at the bitline, propagating through the drain select transistor and the channel of the memory cells in the string, reaches the channel of the memory cell to be programmed. Here, the voltage difference of approximately 20 V between the control gate and the channel that is experienced by the selected memory cell is sufficient to cause electron tunneling into the floating gate. On the contrary, if the bitline is biased at a higher potential, for example equal to the supply voltage (Vdd, e.g., 3 V), like the drain select line DSL, the drain select transistor 125*d* turns off as soon as the voltage of the memory cell string rises following (due to capacitive coupling) the voltage applied to the wordlines; the channels of the memory cells of the selected memory cell string thus remain floating, and the string channel voltage is raised to a value such that the control gate-to-channel voltage difference at the selected memory cell is not sufficient to cause significant electron tunneling, and the memory cell is not programmed. In this way, by applying to the selected bitlines the proper voltage, the cells 110 of the selected page to be brought to the logic value "0" are then programmed, while the other cells 110 are left unchanged.

Figure 2:
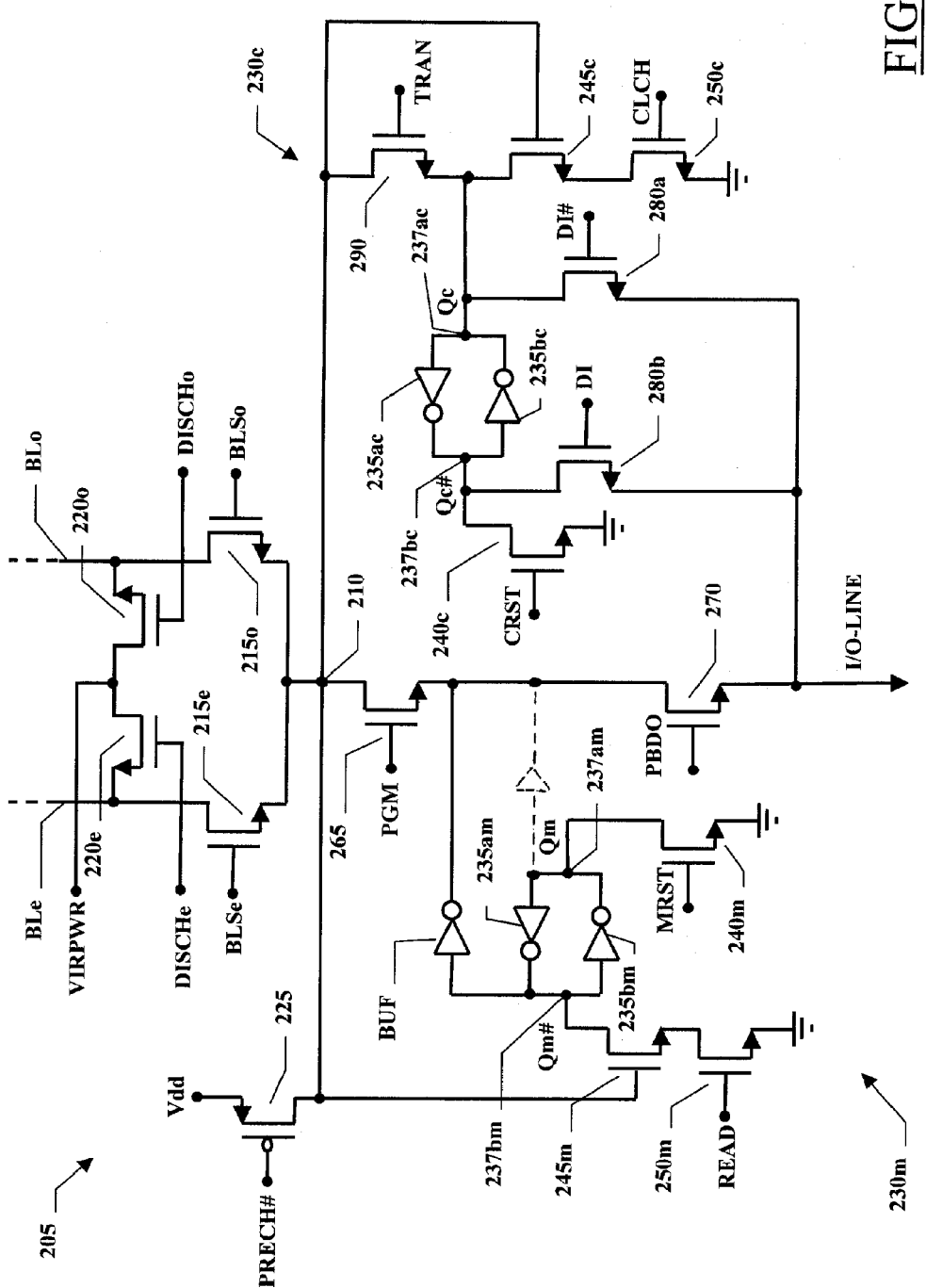
FIG. 2 is a circuit schematic of the page buffer of the memory of FIG. 1 in accordance with one embodiment of the present invention.

FIG. 2 shows the circuit structure of the page buffer 130 according to one embodiment of the present invention.

In the exemplary embodiment herein described, it is assumed that the page buffer 130 is adapted to implement operations more complex than a simple PAGE READ and a simple PAGE PROGRAM; in particular, it is assumed that the page buffer is adapted to implement operations such as a CACHE PROGRAM and a COPYBACK PROGRAM. The page buffer 130 thus includes two registers, namely a main register 130*m* and a cache register 130*c*, visible in FIG. 1, with each of the registers 130*m* and 130*c* including a number of latches corresponding to, in particular equal to the size (number of bits) of, the memory page. FIG. 2 depicts the circuit structure of a page buffer unit that includes one such latch of the main register 130*m* and the corresponding latch of the cache register 130*c*, and shows the way these two latches are operatively coupled to one another.

The page buffer includes a read/write unit 205 for each pair of adjacent bit lines. Particularly, an even bit line BLe and an odd bit line BLo are connected to a common node 210 through respective N-channel MOS transistors 215*e* and 215*o*. The transistors 215*e* and 215*o* have their respective drain terminals connected to the corresponding bit lines BLe and BLo, and their source terminals connected to the common node 210; the gate terminals of the transistors 215*e* and 215*o* are controlled by respective select signals BLSe and BLSo. Two N-channel MOS transistors 220*e* and 220*o* are provided, each one for precharging/discharging the respective bit line BLe and BLo to a predefined biasing voltage VIRPWR (such a precharge/discharge operation is for example performed before any read/write operation). For this purpose, the transistors 220*e* and 220*o* have their source terminals connected to the corresponding bit lines BLe and BLo; the drain terminals of the transistors 220*e* and 220*o* are connected together and to a terminal providing the biasing voltage VIRPWR. The gate terminals of the transistors 220*e* and 220*o* are controlled by respective precharge/discharge signals DISCHe and DISCHo.

A P-channel MOS transistor 225 is used for precharging the node 210 at the beginning of the generic read/write operation. For this purpose, the transistor 225 has its drain terminal connected to the node 210, its source terminal connected to a terminal providing a supply voltage Vdd (for example, 3 V), and its gate terminal controlled by a precharge signal PRECH# (the suffix # being used to indicate that the signal is asserted at the logic value "0"—corresponding to the ground potential—and is deasserted at the logic value "1"—corresponding to the supply voltage Vdd). Although in some embodiments the signal PRECH# is a digital signal, nothing prevents an analog signal from being used, taking any value between ground and the supply voltage Vdd.

The read/write unit 205 includes a main latch 230*m* (one of the latches making up the main register 130*m*) and a cache latch 230*c* (the corresponding latch of the cache register 130*c*). The cache latch 230*c* is used to load and temporarily store the target value of a data bit to be written into the corresponding selected cell; the main latch 230*m* is used to write the target value received from the cache latch 205*m* into the selected memory cell, or to read and temporarily store the data bit stored in the selected memory cell.

The main latch 230*m* is formed by two inverters 235*am* and 235*bm* connected in a loop, with the input terminal of the inverter 235*am* connected to the output terminal of the inverter 235*bm* so as to define a node 237*am* that provides a signal Qm, and with the output terminal of the inverter 235*am* connected to the input terminal of the inverter 235*bm* so as to define a node 237*bm* that provides a signal Qm# that is the logical complement of the signal Qm.

An N-channel MOS transistor 240*m* is used to reset the main latch 230*m*. For this purpose, the transistor 240*m* has its drain terminal connected to the node 237*am*, its source terminal connected to ground and its gate terminal controlled by a main latch reset signal MRST. The main latch 230*m* is set by two N-channel MOS transistors 245*m* and 250*m* that are connected in series. The transistor 245*m* has its drain terminal connected to the node 237*bm* and its source terminal connected to the drain terminal of the transistor 250*m*; the source terminal of the transistor 250*m* is connected to ground. The gate terminal of the transistor 245*m* is controlled by the voltage at the node 210, whereas the gate terminal of the transistor 250*m* is controlled by a latching or read signal READ.

An N-channel MOS transistor 265 and, according to this embodiment of the present invention, a buffer element BUF are used to couple the main latch 230*m* to the node 210, and thus to the selected bit line BLe or BLo, in order to program the selected memory cell 110 during a write operation. For this purpose, the transistor 265 has its drain terminal connected to the node 210 and its source terminal connected to an output of the buffer element BUF, which, in a simple but not limitative embodiment, is comprised of an inverter having its input connected to the node 237*bm*. The gate terminal of the transistor 265 is controlled by a programming signal PGM.

In an alternative embodiment, the buffer element BUF includes more than one inverter, for example connected in cascade, and is either inverting or non-inverting; in the latter case it may have an input connected to the node 237*am* instead of the node 237*bm*.

The read data bit that has been loaded into the main latch 230*m* during the read operation is placed on an I/O data line I/O-LINE, which is connected to a respective I/O buffer and, then, to a respective I/O terminal I/O, by the buffer element BUF and an N-channel MOS transistor 270, which has its drain terminal connected to the output of the buffer element BUF, its source terminal connected to the line I/O-LINE and its gate terminal controlled by a signal DOUT that, when asserted, enables transfer of the data bit stored in the main latch 230*m* to the output buffers and then to the respective I/O terminal I/O.

The cache latch 230*c* is formed by two inverters 235*ac* and 235*bc* connected in a loop. The input terminal of the inverter 235*ac* is connected to the output terminal of the inverter 235*bc* to define a node 237*ac* that provides a signal Qc; likewise, the output terminal of the inverter 235*ac* is connected to the input terminal of the inverter 235*bc* to define a node 237*bc* that provides a signal Qc# that is the logical complement of the signal Qc.

An N-channel MOS transistor 240*c* is used to reset the cache latch 230*m*. For this purpose, the transistor 240*c* has its drain terminal connected to the node 237*bc*, its source terminal connected to ground and its gate terminal controlled by a reset signal CRST. The cache latch 230*c* is set by two N-channel MOS transistors 245*c* and 250*c* that are connected in series. Particularly, the transistor 245c has its drain terminal connected to the node 237ac and its source terminal connected to the drain terminal of the transistor 250c; the source terminal of the transistor 250c is connected to ground. The gate terminal of the transistor 245c is controlled by the voltage at the node 210, while the gate terminal of the transistor 250c is controlled by a latching signal CLCH.

Two N-channel MOS transistors 280a and 280b are used to load a data bit to be written into the cache latch 230c during an input phase, at the beginning of a write operation. For this purpose, the transistor 280a has its drain terminal connected to the node 237ac, and the transistor 280b has its drain terminal connected to the node 237bc. The gate terminal of the transistor 280b receives an input signal DI (whose logic state represents the target value to be loaded into the cache latch 230c), while the gate terminal of the transistor 280a receives a signal DI# that is the logical complement of the signal DI. The source terminals of the transistors 280a and 280b are both connected to the I/O data line I/O-LINE, which, at the beginning of the write operation, is kept grounded (for example, by a MOS transistor that is activated to tie line I/O-LINE to the ground line).

The cache latch 230c further includes an N-channel MOS transistor 290 for transferring the target value to the main latch 230m. For this purpose, the transistor 290 has its drain terminal connected to the node 237ac, its source terminal connected to the common node 210 and its gate terminal is controlled by an transfer enabling signal TRAN.

Before any read/write operation on a selected bit line BL, such as the bit line BLe (similar considerations apply to the other bit line BLo), the corresponding precharge/discharge signal DISCHe is asserted. As a consequence, the transistor 220e turns on, so as to apply the biasing voltage VIRPWR to the selected bit line BLe.

In order to perform a PAGE READ operation, only the main latch 230m is used. The selected bitline BLe (selected by the column decoder 125c) is connected (through the transistor 215e) to the common node 210, and is precharged (by the transistor 225) to the proper initial value, in the example herein considered the supply voltage Vdd. The other bitline BLo, which is not selected (transistor 215o is off), is discharged (through the transistor 220o) to the voltage VIRPWR, preferably to ground (so as to limit the capacitive coupling).

As mentioned in the foregoing, the drain select transistor 120d and the source select transistor 120s are turned on by the row decoder 125r, by asserting the drain select line DSL and the source select line SSL. Furthermore, the row decoder 125r biases the wordline WL to which the selected memory cell 110 belongs to a voltage that is intermediate between the erased memory cell threshold voltage value and the programmed memory cell threshold voltage value; the remaining wordlines controlling the gates of the other memory cells 110 of the same string are all brought to a potential that is sufficiently high to ensure that such memory cells are turned on irrespective of their programming state.

There follows an evaluation phase, during which if the accessed memory cell is erased the potential of the bitline BLe, and thus that of the node 210, falls to ground, whereas if the memory cell is programmed the potential of the bitline BLe, and thus that of the node 210, remains at the precharge potential (Vdd).

Then, the potential at the node 210 is sensed by asserting the signal READ, thereby turning the transistor 250m on. The logic state corresponding to the potential at the node 210 is thus loaded into the main latch 230m.

Finally, the signal PBDO is asserted and the transistor 270 is turned on, so that the logic state latched in the main latch 230m is brought onto the I/O data line I/O-LINE, driven by the buffer element BUF. In this way, the read data bit is transferred to the I/O buffers 140, and then to one of the I/O terminals I/O.

In a PAGE PROGRAM operation, the two bitlines BLe and BLo are preliminarily precharged to the same program inhibition voltage, e.g., 3 V.

The target data bit to be written into the selected memory cell 110 is first loaded into the cache latch 230c. For this purpose, the I/O data line I/O-LINE (and thus the source terminals of the transistors 280a and 280b) is kept grounded. The target data bit (represented by the signal DI) and its logical complement (represented by the signal DI#) are then applied to the gate terminals of the transistors 280b and 280a, respectively. Therefore, if the target data bit is "1" the transistor 280b turns on (while the transistor 280a remains off), so as to bring the node 237bc to ground; in this way, the signal Qc# is brought to the logic value "0" and the signal Qc is brought to the logic value "1". Conversely, if the target data bit is "0", the transistor 280a turns on (while the transistor 280b remains off), so as to bring the node 237ac to ground; in this way, the signal Qc takes the logic value "0" and the signal Qc# takes the logic value "1".

At the same time, the main latch 230m is reset by asserting the reset signal MRST. As a result, the transistor 240m turns on; in this way, the signal Qm is brought to the logic value "0" and the signal Qm# is brought to the logic value "1".

The target data bit contained in the cache latch 230m is then transferred to the main latch 230m by asserting the signal TRAN. The gate terminal of the transistor 245m is thus brought to the voltage present at the node 237ac; in this way, if the signal Qc is at the logic value "1" the transistor 245m turns on, while if the signal Qc is at the logic value "0" the transistor 245m remains off. The signal READ is then asserted, so as to turn the transistor 250m on. Therefore, if the transistor 245m is on (logic state at node Qc equal to "1") the node 237bm is brought to ground (with the signal Qm# that takes the logic value 0 and the signal Qm that takes the logic value 1). Conversely, if the transistor 245m is off (logic state at node Qc equal to "0") the logic value in the main latch 230m is not changed (with the signal Qm# at the logic value "1" and the signal Qm at the logic value "0").

By asserting the signal PGM, the transistor 265 is turned on. Depending on the logic value at the node 237bm, the buffer element BUF drives the selected bit line BLe to the proper voltage. In this way, when the selected memory cell is to be programmed (signal Qm at the logic value "0"), the potential of the selected bitline BLe is brought to ground, and the selected memory cell is thus biased in a condition favorable to cause tunneling of electric charges into its floating gate.

Usually, a program verify phase follows the programming phase.

Another operation that can be performed by the page buffer herein described is the CACHE PROGRAM. In this case, similarly to the previously described PAGE PROGRAM operation, the target data bit to be written into the selected memory cell is first loaded into the cache latch 230c, and then transferred into the main latch 230m, from which the data bit is then applied to the selected bit line. It can be appreciated that after the data bit has been moved from the cache latch 230c into the main latch 230m, the cache latch is available, and can be used to load another data bit corresponding to another memory page to be written, even if the programming of the previous data bit is still going on. In practice, while the main latch 230m applies (through the buffer element BUF and the transistor 265) the data bit to be programmed to the node 210, the cache latch 230c, isolated from the node 210 by the fact that the transistor 290 is off, receives and stores a new data bit, in the same way as is described above.

A still further operation that can be implemented using the page buffer described herein is the COPYBACK PROGRAM operation, which is used to copy the content of a selected memory page into another selected memory page, in a way that is totally transparent to the outside world and without the need to output data. In this case, a selected memory cell is accessed, and the content thereof is read as in the previously described PAGE READ operation. However, instead of loading the logic state corresponding to the potential developing at the node 210 into the main latch 230m, such a logic state is loaded into the cache latch 230c, by asserting the signal CLCH. The data bit loaded into the cache latch 230c is then transferred into the main latch in the same way as is described above in connection with the PAGE PROGRAM operation, by asserting the signals TRAN and READ. Finally, the data bit stored in the main latch 230m is applied to the selected bit line in the same way as is described above in connection with the PAGE PROGRAM operation, by asserting the signal PGM.

The four operations described above are merely exemplary, and not meant to be limiting; other operations are possible.

The provision of the buffer element BUF decouples the output (in the example herein described, the node 237bm, and in alternative embodiments the node 237am) of the main latch of the page buffer latch (in the example shown, the main latch 230m) from lines such as the bitline and the I/O data line, which have a relatively high capacitive load associated therewith. Thus, the output of the page buffer latch is never "short-circuited" (directly connected to the bitline or to the I/O data line).

This prevents the latch itself from not being able to properly drive the selected bitline to the proper voltage due to effects of charge sharing between the (heavy) stray capacitance associated with the selected bitline or the I/O data line and the (tiny) parasitic capacitance associated with the latch output.

Thus, the provision of the buffer element BUF overcomes the problems encountered during the transfer of the write data bit from the main latch to the selected bitline, or the transfer of the read data bit from the main latch to the I/O data line.

Expediently, the provision of the buffer element BUF allows the write operations to be implemented in a different way compared to the conventional way in which they are implemented.

As described in the foregoing, conventionally, when a selected memory cell of a selected bitline, e.g., the bitline BLe, is to be programmed, both the bitlines BLe and BLo are actually precharged to the program inhibition voltage (typically, the supply voltage Vdd). Subsequently, the data bit stored in the main latch 230m is transferred only to the selected bitline BLe (by activating the transistor 215e). If the content of the main latch is a "1", the selected bitline BLe remains charged at the program inhibition voltage, for example the supply voltage Vdd. This inhibits the tunneling of electrons into the floating gate of the selected memory cell, for the reasons described in the foregoing; otherwise, if the content of the main latch is a "0", the selected bitline BLe is discharged to ground. In the conventional page buffer, it is the very main latch of the page buffer that has the function of discharging the bitline stray capacitance, and this gives rise to the problems discussed above. It can be appreciated that, according to this conventional procedure, all the bitlines, particularly all the bitlines of the selected memory page, are first precharged to the program inhibition voltage; then, in the selected memory page, a number of bitlines equal to the number of "0"s in the data word to be programmed need to be discharged to ground. This is disadvantageous.

Using the page buffer according to the embodiment of the present invention herein described, it is possible to avoid the initial precharge of all of the bitlines to the program inhibition voltage. All of the bitlines are instead initially discharged to ground. Then, it is the main latch 230m of the page buffer that charges to the program inhibition voltage the bitlines corresponding to memory cells not to be programmed; all the bitlines to which memory cells to be programmed belong already are at the correct potential. This avoids an unnecessary precharge followed by a discharge of the bitlines containing the memory cells to be programmed.

Although in the foregoing reference has been made to a page buffer including two registers, namely a main register and a cache register, this is not intended to be limiting. The present invention can just as well be applied in a case in which the page buffer includes only one register, or more than two registers. Also, although the buffer element has been shown as being provided only in association with one register (the main register) of the page buffer, this is not meant to be limiting. The buffer element can as well be provided in association with the other register (the cache register).

Although the present invention has been disclosed and described by way of an embodiment, it is apparent to those skilled in the art that several modifications to the described embodiment, as well as other embodiments of the present invention are possible without departing from the scope thereof as defined in the appended claims.

For example, although the page buffer has been described as having the same size as the memory page, this is not meant to be limiting. The page buffer may have for example a bigger size than the memory page.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of transferring data from a register to signal lines in an electrically programmable memory, the memory including a plurality of memory cells forming a plurality of memory pages, and a page buffer that includes the register, the signal lines selectively transferring the data stored in the register to the memory cells of a selected one of the memory pages and an output interface of the memory, the method comprising the steps of:
   at least temporarily storing in the register data read from or to be written to the memory cells of the selected one of the memory pages; and
   buffering outputs of the register so as to decouple the outputs of the register from the signal lines,
   wherein the signal lines include bitlines that are each coupled to some of the memory cells and data lines that are coupled to the output interface of the memory, and
   the buffering step comprises selectively driving the bitlines or the data lines according to a data word that is stored in the register.

2. The method according to claim 1,
wherein the storing step comprises loading the data word into the register, and
the buffering step comprises:
  biasing the bitlines to a programming voltage; and
  using buffer elements of the register to drive the bitlines that are coupled to memory cells that are not to be programmed to a program inhibiting voltage.

3. The method according to claim 1,
wherein the storing step comprises loading the data word into the register, and
the buffering step comprises using buffer elements of the register to drive the data lines according to the data word that is stored in the register.

4. The method according to claim 1,
wherein the register is a main register, and the page buffer further includes a cache register, and
the storing step comprises:
  loading the data word into the cache register; and
  transferring the data word from the cache register to the main register for writing to the memory cells.

5. The method according to claim 1,
wherein the data word is to be written to selected ones of the memory cells, and
the method further comprises the step of transporting the data word from the bitlines to the selected ones of the memory cells.

6. The method according to claim 1, further comprising the steps of:
  reading the data word from selected ones of the memory cells; and
  transporting the data word from the data lines to the output interface of the memory.

7. The method according to claim 1,
wherein the register comprises a plurality of latches, and
each of the latches of the register includes first and second inverters connected in a loop.

8. The method according to claim 7,
wherein the register further comprises a plurality of buffer elements,
each of the buffer elements has an input connected to an output of the first inverter of a corresponding one of the latches, and an output connected to a node that is selectively coupled to the bitline and the data line.

9. The method according to claim 8, wherein each of the buffer elements of the register is an inverting buffer.

10. The method according to claim 8, wherein each of the buffer elements of the register is a non-inverting buffer.

11. The method according to claim 1, wherein the buffering step comprises providing a first control signal to drive the bitlines, or providing a second control signal to drive the data lines.

12. A method of transferring data in an electrically programmable memory, the method comprising the steps of:
  providing a register comprising a plurality of latches and a plurality of buffer elements, each of the latches being coupled to at least two signal lines for transferring a data bit that is stored in the latch, the at least two signal lines including a bitline that is coupled to a plurality of memory cells of the memory and a data line that is coupled to an output interface of the memory;
  at least temporarily storing in the register data read from or to be written to some of the memory cells of the memory; and
  using the buffer elements to decouple outputs of the latches from the signal lines, each of the buffer elements including an input that is coupled to an output of a corresponding one of the latches, and an output that is selectively coupled to both the bitline and the data line so as to selectively drive the bitline or the data line according to the data bit that is stored in the corresponding latch.

13. The method according to claim 12, wherein in the step of using the buffer elements, the bitline transports the data bit to be written to a selected one of the memory cells that is coupled to the bitline.

14. The method according to claim 12, wherein in the step of using the buffer elements, the data line transports the data bit read from a selected one of the memory cells to the output interface of the memory.

15. The method according to claim 12, wherein each of the latches of the register includes first and second inverters connected in a loop.

16. The method according to claim 15, wherein the input of the buffer element is connected to an output of the first inverter of the corresponding latch, and the output of the buffer element is connected to a node that is selectively coupled to the bitline and the data line.

17. The method according to claim 12,
wherein the register is a main register, and
the method further comprises the steps of:
  providing a cache register that is coupled to the main register; and
  loading the data to be written to the memory cells into the cache register and then transferring from the cache register to the main register for writing to the memory cells.

18. The method according to claim 12, wherein the step of using the buffer elements comprises providing a first control signal to couple the output of the buffer element to the bitline, or providing a second control signal to couple the output of the buffer element to the data line.

19. The method according to claim 12, further comprising the steps of:
  providing a first transistor having a first terminal coupled to the output of the buffer element and a second terminal coupled to the bitline for selectively transferring a data bit that is stored in the corresponding latch to the bitline; and
  providing a second transistor having a first terminal coupled to the output of the buffer element and a second terminal coupled to the data line for selectively transferring a data bit that is stored in the corresponding latch to the data line.

* * * * *